US006996902B2

(12) United States Patent
Suzuki et al.

(10) Patent No.: US 6,996,902 B2
(45) Date of Patent: Feb. 14, 2006

(54) METHOD FOR MANUFACTURING A CIRCUIT BOARD

(75) Inventors: Takeshi Suzuki, Izumi (JP); Toshihiro Nishii, Hirakata (JP); Satoru Tomekawa, Kishiwada (JP); Fumio Echigo, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 100 days.

(21) Appl. No.: 10/389,515

(22) Filed: Mar. 14, 2003

(65) Prior Publication Data

US 2003/0170434 A1 Sep. 11, 2003

Related U.S. Application Data

(62) Division of application No. 10/045,344, filed on Oct. 25, 2001, now Pat. No. 6,558,780.

(30) Foreign Application Priority Data

Nov. 9, 2000 (JP) ............................ 2000-341646

(51) Int. Cl.
*H01K 3/10* (2006.01)

(52) U.S. Cl. ............................ 29/852; 29/830; 29/831; 29/832; 29/846; 174/256; 174/262; 428/209; 428/304.4

(58) Field of Classification Search .................. 29/852, 29/830, 831, 832, 846; 428/209, 304.4; 174/256, 174/262

See application file for complete search history.

(56) References Cited

U.S. PATENT DOCUMENTS

| | | | | |
|---|---|---|---|---|
| 4,980,217 | A | 12/1990 | Grundfest et al. | |
| 5,010,232 | A | 4/1991 | Arai et al. | |
| 5,346,750 | A | 9/1994 | Hatakeyama et al. | |
| 5,688,408 | A * | 11/1997 | Tsuru et al. | 216/17 |
| 6,207,259 | B1 * | 3/2001 | Iino et al. | 428/209 |
| 6,224,965 | B1 * | 5/2001 | Haas et al. | 428/209 |
| 6,459,046 | B1 | 10/2002 | Ochi et al. | |

FOREIGN PATENT DOCUMENTS

| | | |
|---|---|---|
| EP | 0 568 930 | 11/1993 |
| JP | 6-268345 | 9/1994 |
| JP | 07-099376 | 4/1995 |

* cited by examiner

*Primary Examiner*—Carl J. Arbes
*Assistant Examiner*—Tim Phan
(74) *Attorney, Agent, or Firm*—Hamre, Schumann, Mueller & Larson, P.C.

(57) ABSTRACT

A circuit board includes an electrical insulator layer formed of a reinforcer sheet with density distribution in its in-plane direction, an electrical conductor filled in a plurality of inner via holes provided in the electrical insulator layer in its thickness direction, and a wiring layer connected to the electrical conductor. The inner via holes provided in a high-density portion of the reinforcer sheet are formed to have a smaller cross-section than the inner via holes provided in a low-density portion of the reinforcer sheet. In this manner, it is possible to provide a circuit board that can achieve a high-density wiring and an inner via connection resistance with less variation, when a base material including a reinforcer sheet with density distribution in its in-plane direction such as a glass-epoxy base material is used for an insulator layer.

8 Claims, 10 Drawing Sheets

METHOD FOR MANUFACTURING A CIRCUIT BOARD

CROSS REFERENCE TO RELATED DOCUMENT

The present application is a Division of Application Ser. No. 10/045,344, filed on 25th Oct., 2001, now U.S. Pat. No. 6,558,780 B2, which claims the benefit of Japanese Application, JAPAN 2000-341646, filed on 9th Nov. 2000.

BACKGROUND OF THE INVENTION

1. Field of the Invention

The present invention relates to a circuit board and a method for manufacturing the same. In particular, the present invention relates to a circuit board using a reinforcer sheet with density variations in its in-plane direction and a method for manufacturing the same.

2. Description of Related Art

In recent years, accompanying the reduction in size and weight and the improvement in function and performance of electronic equipment, there has been an increasing demand for low-cost multilayered circuit boards allowing a high density mounting of semiconductor chips such as large-scale integrated circuits (LSIs), in the field of not only industrial appliances but also home electronic appliances.

In order to respond to such a market demand, the technology has been developed in which, instead of a conventional ceramic multilayered board, a resin multilayered circuit board that can be supplied at lower cost is made suitable for the high density mounting (a high density wiring board).

An example of such a circuit board includes a resin multilayered board having an inner-via-hole structure over all the layers as disclosed in JP 6(1994)-268345 A. This resin multilayered board adopts an inner via connection method that can connect desired positions of desired wiring layers by an electrically conductive paste, namely, the inner-via-hole structure over all the layers, thereby providing a low cost circuit board suitable for the high density mounting.

In a method for manufacturing this circuit board, inner via holes first are formed in a compressible insulator layer (an aramid-epoxy prepreg), and an electrically conductive paste is filled in the through holes. Thereafter, copper foils are superposed on both sides of the insulator layer, followed by heating and compression with a hot press, thereby curing resins in the insulator layer and the electrically conductive paste. This adheres the copper foils to the insulator layer and electrically connects the copper foils on both sides via the electrically conductive paste. Finally, the copper foils on both sides are processed into a wiring pattern, thus completing a double-sided circuit board.

Because of its high-density wiring and low connection resistance with less variation, this circuit board is highly valued in the market.

The reason why the high-density wiring is needed has been described above, while the usefulness of the connection resistance with less variation will be described in the following. That is, circuit resistance including the connection resistance is an important parameter for a circuit design. Accordingly, if the circuit resistance varies from one product to another, this causes a problem in that the circuit design is impossible or that the circuit resistance of the product deviates from a designed value so that the product cannot operate properly. Thus, the connection resistance has to have less variation.

Especially, more inner via holes are involved in one circuit in the connection by the inner via holes than in the conventional connection by the through holes. Therefore, there is a more stringent requirement with respect to variations.

However, the above-described circuit board technology having the inner-via-hole structure over all the layers has had a following problem. As the insulator layer mentioned above, a composite material of an aramid non-woven fabric as a reinforcer and an epoxy resin (an aramid-epoxy base material) is used. In this case, because of their high moisture absorbency, it is necessary to manage aramid fibers so as to prevent them from absorbing moisture by vacuum-packing or the like. Such management would increase cost.

On the other hand, a glass-epoxy base material used in a general circuit board is a material obtained by impregnating woven fabric made of glass fibers with an epoxy resin. Since the glass fibers do not absorb moisture, using the glass-epoxy base material is advantageous in the management of water absorption. Furthermore, because its mechanical strength is high, it has been desired that the glass-epoxy base material is used as the insulator layer so as to achieve the circuit board having the inner-via-hole structure over all the layers by the inner via connection.

However, when simply attempting to apply the above-described inner-via-hole technology over all the layers to the glass-epoxy base material, there arises a problem in that the variations in the connection resistance of the inner via holes increase. The inventors of the present invention conducted a study to find as its cause that the glass woven fabric serving as the reinforcer had variations in density (portions in which warps and wefts overlap each other and those in which they do not) in an in-plane direction. More specifically, in the hot press process of heating and compression, the inner via holes provided in the low-density portion of the reinforcer (where the warps and wefts do not overlap each other) expand laterally because there is less reinforcement on their side wall surfaces. In other words, applied pressure dissipates laterally. Consequently, a sufficient compression force is not applied in the longitudinal direction of the inner via hole, so that electrical conductors cannot be connected sufficiently, thus increasing an electrical connection resistance.

The unevenness in thickness and density in the in-plane direction causes such variations in the electrical connection resistance not only in the glass cloth impregnated with an epoxy resin but also in non-woven fabric, a sheet and a film.

SUMMARY OF THE INVENTION

It is an object of the present invention to solve the problems described above and to provide a circuit board and a method for manufacturing the same that can achieve a high-density wiring and an inner via connection resistance with less variation even when a base material including a reinforcer sheet with density distribution in its in-plane direction such as a glass-epoxy base material is used for an insulator layer.

In order to achieve the above-mentioned object, a circuit board of the present invention includes an electrical insulator layer formed of a reinforcer sheet with density distribution in its in-plane direction, an electrical conductor filled in a plurality of inner via holes provided in the electrical insulator layer in its thickness direction, and a wiring layer connected to the electrical conductor. The inner via holes provided in a high-density portion of the reinforcer sheet are formed to have a smaller cross-section than the inner via holes provided in a low-density portion of the reinforcer sheet.

Next, a method for manufacturing a circuit board of the present invention includes providing a plurality of inner via holes to be filled with an electrically conductive paste in an insulator layer having a reinforcer sheet with density distribution in its in-plane direction, with the inner via holes provided in a high-density portion of the reinforcer sheet being formed to have a smaller cross-section than the inner via holes provided in a low-density portion of the reinforcer sheet, filling the electrically conductive paste in the inner via holes, and laminating a wiring layer or a metal foil for forming the wiring layer so as to be connected to the electrically conductive paste, followed by heating and compression.

According to the present invention, it becomes possible to provide a circuit board and a method for manufacturing the same that can achieve a high-density wiring and an inner via connection resistance with less variation even when a base material including a reinforcer sheet with density distribution in its in-plane direction such as a glass-epoxy base material is used for an insulator layer.

DESCRIPTION OF THE PREFERRED EMBODIMENTS

Figure 1:
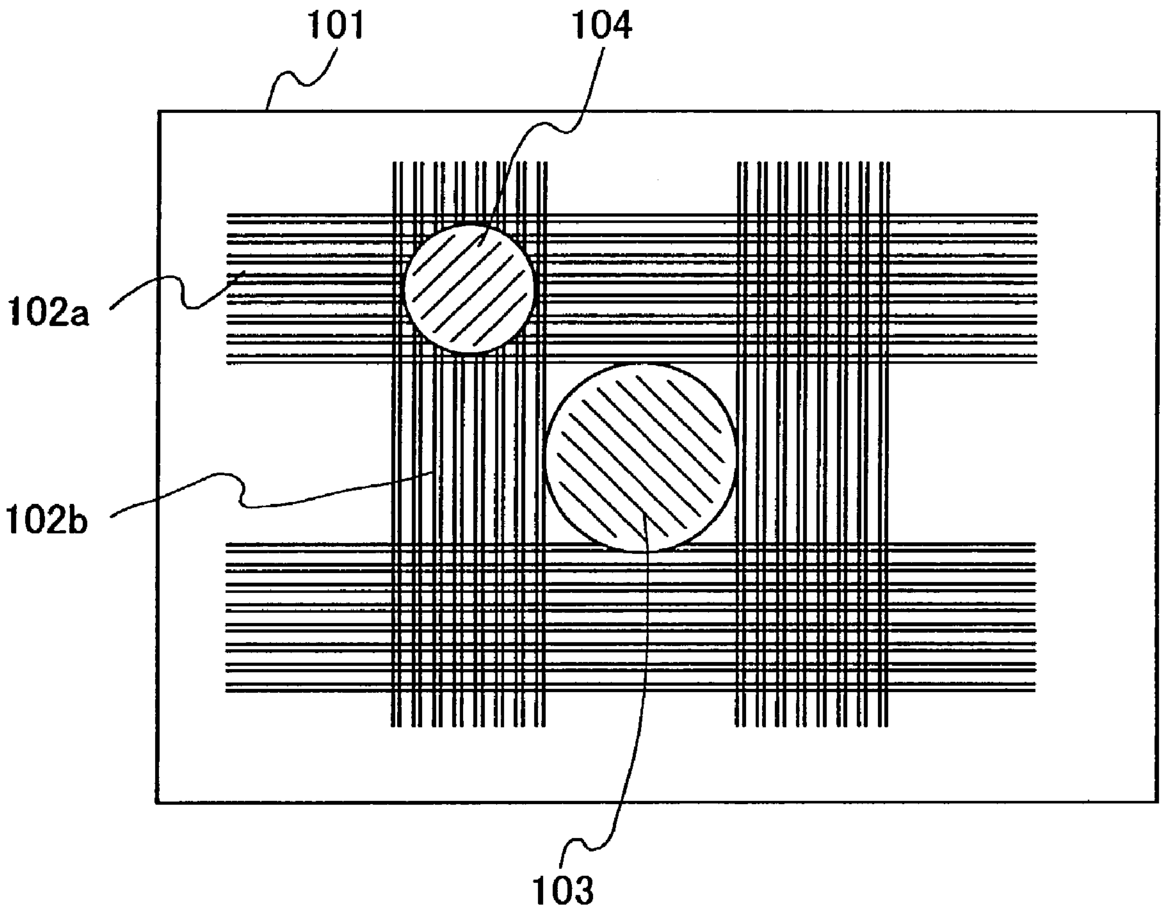
FIG. 1 is a schematic plan view showing a circuit board according to a first embodiment of the present invention.

In the case of making a connection by pressure using an electrically conductive paste, the connection resistance of inner via holes suddenly becomes unstable so as to have increased variation when the ratio of (insulator layer thickness/via hole diameter) exceeds 1. Thus, in order to achieve a via hole with a small diameter (for example, a diameter of 50 μm) in a circuit board, it is preferable that the insulator layer has a thickness of 50 μm or smaller. However, when a glass-epoxy base material or an aramid-epoxy base material is used, a circuit board as a core substrate usually has a thickness of 50 μm or larger. In addition, an excessively thin core substrate is not preferable because the mechanical strength is reduced. Therefore, it is preferable that a thin insulator layer has a thickness of 50 μm or smaller and the ratio of the insulator layer thickness/the via hole diameter is 1 or smaller.

In the present invention, it is preferable that the reinforcer sheet with density distribution in its in-plane direction is a woven fabric or a non-woven fabric formed of at least one fiber selected from the group consisting of a synthetic fiber and an inorganic fiber. Of course, the reinforcer sheet with density distribution in its in-plane direction may be a film formed of a synthetic resin.

Also, it is preferable that the reinforcer sheet with density distribution in its in-plane direction is a woven fabric formed of a glass fiber.

Furthermore, it is preferable that the inner via holes provided in overlapping portions of warps and wefts of the woven fabric formed of the glass fiber have a smaller cross-section than the inner via holes provided in other portions.

Moreover, it is preferable that the inner via holes having a larger cross-section have a smaller amount of protruding fibers on a side wall surface thereof than the inner via holes having a smaller cross-section.

In addition, it is preferable that a plurality of the wiring layers are provided, and at least one of the wiring layers is embedded in the insulator layer.

It is preferable that the inner via holes have a small cross-section in the high-density portion of the reinforcer sheet, while the inner via holes have a large cross-section in the low-density portion of the reinforcer sheet.

Also, a circuit board formed of a compressible electrical insulating material further may be laminated on one surface of the circuit board of the present invention.

Furthermore, a circuit board formed of a compressible electrical insulating material further may be laminated as a core substrate between the circuit boards of the present invention arranged on both sides of the core substrate.

Moreover, the circuit board of the present invention is used as a core substrate, and at least one circuit board formed of an insulator layer thinner than the insulator layer of the core substrate further may be laminated on at least one surface of the core substrate.

In addition, the larger cross-section of the inner via holes is preferably 1.15 to 10 times, more preferably 1.4 to 5 times, particularly preferably 1.4 to 2 times as large as the smaller cross-section. The cross-section difference of less than 1.15 times makes it difficult to reduce variations in electrical resistance caused by the density variations of the reinforcer sheet, while that of more than 10 times results in an excessively low via resistance, making it difficult to reduce variations in the via resistance.

Next, in a method of the present invention, it is preferable that the inner via holes provided in the high-density portion of the reinforcer sheet are formed to have a smaller cross-section than the inner via holes provided in the low-density portion of the reinforcer sheet by inserting a rotating drill in a thickness direction of the reinforcer sheet to form a through hole, stopping the drill while keeping it rotating, and then pulling out the drill.

Also, it is preferable that the inner via holes provided in the high-density portion of the reinforcer sheet are formed to have a smaller cross-section than the inner via holes provided in the low-density portion of the reinforcer sheet by thermal laser machining.

Furthermore, it is preferable that a plurality of the wiring layers are provided, and at least one of the wiring layers is embedded in the insulator layer.

In the above description, when the glass-epoxy base material is used, the cross-section of the inner via holes in sparse portions of the glass cloth is preferably at least 1.15 times, further preferably about 1.4 times as large as that of the inner via holes in the overlapping portions of warps and wefts thereof. Within this range, the variation in via resistance is reduced.

According to a circuit board of the present invention, it is possible to achieve a circuit board having connection resistance with less variation.

According to another circuit board of the present invention, it is possible to achieve a circuit board having connection resistance with less variation and high connection reliability.

Also, in another circuit board of the present invention, it is preferable that at least one of the wiring layers is embedded in the insulator layer. With this example, it is possible to achieve a circuit board having connection resistance with still less variation.

Furthermore, according to a multilayered circuit board of the present invention, it is possible to achieve a multilayered circuit board having connection resistance with still less variation over all the layers.

Moreover, according to a multilayered circuit board of the present invention, it is possible to achieve a multilayered circuit board having a fine wiring layer on its surface by using a circuit board having connection resistance with less variation as a core substrate.

In addition, according to a method for manufacturing a circuit board of the present invention, a circuit board having connection resistance with less variation can be manufactured easily.

In the method for manufacturing a circuit board of the present invention, it is preferable to include embedding at least one of the wiring layers in the insulator layer. With this example, a circuit board having connection resistance with still less variation can be manufactured easily.

In addition, according to a method for manufacturing a multilayered circuit board of the present invention, a multilayered circuit board having connection resistance with less variation over all the layers can be manufactured easily.

Moreover, according to a method for manufacturing a multilayered circuit board of the present invention, a multilayered circuit board having a fine wiring layer on its surface can be manufactured easily by using a circuit board having connection resistance with less variation as a core substrate.

First, materials used in the present invention will be described.

(Electrical Conductor for Forming Inner Via Hole)

An electrical conductor used for forming inner via holes can be a resin composition containing electrically conductive powder (an electrically conductive paste). The electrically conductive paste is preferable because its electrical conductivity increases when being compressed.

An electrically conductive filler used here can be a filler formed of at least one metal selected from the group consisting of gold, silver, copper, nickel, palladium, lead, tin, indium and bismuth, an alloy thereof or a mixture thereof. It also is possible to use a coated filler obtained by coating the above-mentioned metal or alloy onto a ball formed of the above-mentioned metal or alloy, an oxide of alumina or silica, or an organic synthetic resin.

The form of the electrically conductive filler is not limited specifically, but can be powder, fibrous filler, granulated powder, spherical balls or a mixture thereof.

A resin used for a binder of the resin composition can be a liquid epoxy resin, a polyimide resin, a cyanate ester resin or a phenol resol resin. The epoxy resin can be a glycidyl ether epoxy resin such as a bisphenol A type epoxy resin, a bisphenol F type epoxy resin or a bisphenol AD type epoxy resin, or an epoxy resin containing two or more epoxy groups such as an alicyclic epoxy resin, a glycidyl amine type epoxy resin or a glycidyl ester type epoxy resin. In addition, an epoxy compound containing one epoxy group also may be contained as a reactive diluent.

If necessary, additives such as a dispersing agent or a solvent, for example, butyl cellosolve, ethyl cellosolve, butyl carbitol, ethyl carbitol, butyl carbitol acetate, ethyl carbitol acetate or α-terpineol can be present.

The electrical conductor of the present invention is not limited to the above-mentioned electrically conductive paste, but can be an inner via connecting material that makes an electrical connection by pressure, for example, a via post formed of metal such as gold, silver, copper, nickel, palladium, lead, tin, indium or bismuth.

(Electrical Insulator Layer with Density Distribution in In-Plane Direction)

The material for an electrical insulator layer with density distribution in its in-plane direction can be a glass-epoxy base material. The glass-epoxy base material is a composite material obtained by impregnating a glass woven fabric with an epoxy resin. The glass-epoxy base materials at B stage (in a semi-cured state) and those at C stage (in a cured state) are commercially available as a material for circuit boards. They are preferable because of their excellent mechanical strength and availability at low cost. It is especially preferable to use the base material at B stage (in the semi-cured state) rather than that at C stage (in the cured state). This is because, compared with the cured state, the resin in the semi-cured state is easier to perforate with a laser, shows larger difference in processability from the glass cloth as the reinforcer, and needs lower effective pressure for compressing the electrically conductive paste. However, the electrical insulator layer is not limited to these examples of the base material, but can be an insulator layer containing a reinforcer sheet with a density distribution (density variation) in the in-plane direction. For example, it is possible to use a composite material sheet or a composite material film that is obtained by impregnating woven fabric or non-woven fabric with a thermoplastic resin or a thermosetting resin. The woven fabric or non-woven fabric may be formed of organic fibers such as PBO (polyparaphenylene benzobisoxazole) fibers, PBI (polybenzimidazole) fibers, aramid fibers, PTFE (polytetrafluoroethylene) fibers, PBZT (polyparaphenylene benzobisthiazole) fibers or all aromatic polyester fibers, or inorganic fibers such as glass fibers. The thermosetting resin may be an epoxy resin, a polyimide resin, a phenolic resin, a fluorocarbon resin, an unsaturated polyester resin, a PPE (polyphenylene ether) resin, a bismaleimide triazine resin or a cyanate ester resin.

The thickness of the electrical insulator layer is not limited specifically, but can be about 0.02 to 0.5 mm, which is a general thickness of commercially available insulator layer. It is preferable that the electrical insulator layer has a weight per unit area ranging from 50 to 800 g/m$^2$.

(Cover Film)

During the manufacturing process, a cover film serves to prevent contamination by dusts and as a mask when filling the electrical conductor, and then is removed in the end. Thus, it is preferable that the cover film is provided at least on the side of filling the electrical conductor in a prepreg. It also is preferable that the surface contacting the prepreg is subjected to a release treatment. The material for the cover film is not limited specifically, but can be, for example, one obtained by applying a silicone-based releasing agent onto a PET (polyethylene terephthalate) film or a PEN (polyethylene naphthalate) film. When the electrically conductive paste is filled by printing, an excess electrically conductive paste that is as thick as the cover film is provided above the inner via hole. After the cover film is peeled off lastly, the electrically conductive paste protrudes from the inner via holes. This protrusion corresponds to the thickness to be compressed in a hot press process. Accordingly, as the cover film becomes thicker, the inner via holes are compressed more so as to achieve lower connection resistance. On the other hand, an excessively thick cover film rips off the electrically conductive paste when being peeled off. For example, the thickness of the cover film preferably is 35 μm or smaller when the inner via hole has a diameter of 200 μm or smaller, while it preferably is 20 μm or smaller when the inner via hole has a diameter of 100 μm or smaller.

(Metal Foil)

A specific example of a metal foil includes an electrolytic copper foil and a rolled copper foil. In the case of the electrolytic copper foil, it is possible to use a commercially available copper foil having a thickness of about 3 to 70 μm. A thin copper foil, especially one of 9 μm or smaller in thickness, can be provided with a carrier for being handled more easily. With regard to a surface roughness of the copper foil, an average roughness Rz ranges, for example, from 0.5 to 10 μm.

The following is a description of embodiments of the present invention, with reference to the accompanying drawings.

First Embodiment

FIG. 1 is a schematic plan view showing a circuit board of the first embodiment. The present embodiment is directed to the case in which a glass-epoxy base material is used for an insulator layer including a reinforcer sheet 101 with density distribution in its in-plane direction. To facilitate an explanation, FIG. 1 shows wefts 102*a* and warps 102*b* of a glass woven fabric inside the base material. An inner via hole 103 that is provided in a portion other than an overlapping portion of glass fibers (a high-density portion of the reinforcer sheet) has a larger cross-section than an inner via hole 104 provided in the overlapping portion. In this embodiment, the cross-section of the inner via hole 103 in the sparse portion of the glass cloth is preferably at least 1.15 times, more preferably at least 1.4 times as large as that of the inner via hole 104 in the overlapping portion thereof. Within this range, the variation in via resistance is reduced.

A circuit board of the present embodiment can be produced as follows.

First, a connection intermediate is produced. Cover films 202 are provided by thermocompression bonding on both surfaces of a glass-epoxy base material (a glass-epoxy prepreg 201) at B stage (in a semi-cured state). Then, inner via holes (through holes 203 and 203' in the present embodiment) are formed at desired positions by a mechanical drill (see FIG. 2A).

Figure 2A:
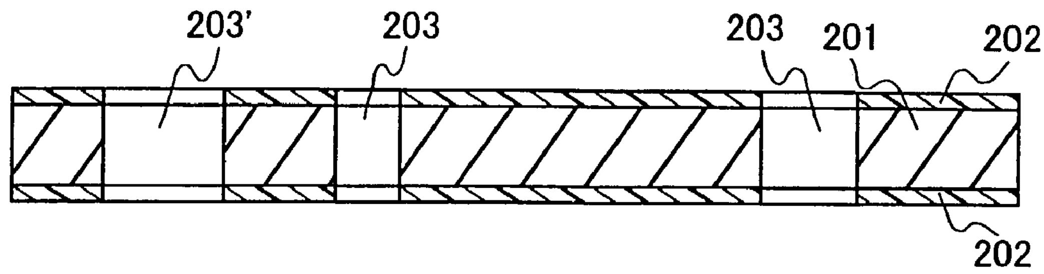
FIGS. 2A to 2D are drawings for explaining processes in a method for manufacturing a circuit board (having through holes) according to the first embodiment of the present invention.
Figure 2B:
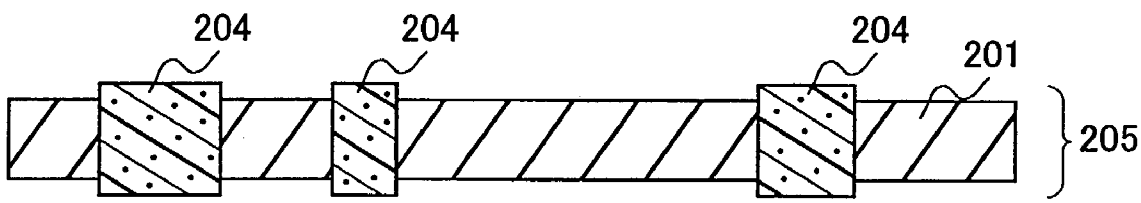

Next, the inner via holes are filled with an electrically conductive paste 204 by printing, and then the cover films 202 are peeled off, thus completing a connection intermediate 205 (see FIG. 2B).

As one exemplary condition of the perforating process in FIG. 2A, the through holes 203 and 203' are formed at a processing speed of about 133 holes per minute by a drill having a diameter of 150 μm and a lowering speed of 2 m per minute. After the hole is pierced, the drill is stopped at a lowered position while being kept rotating for about 0.2 seconds, for example, and then pulled out.

In this case, the diameter of the hole 203 in the dense portion remains intact because the fibers serve as braces, while that of the hole 203' in the sparse portion (the portion rich in resin) increases owing to heat generated during processing, slight deflections of the drill center or the like. In other words, the hole diameter varies continuously according to a fiber amount of a processed portion, so that the hole diameter is inversely proportional to the fiber density in the portion to be perforated. The term "inversely proportional" does not refer to being inversely proportional in a mathematical sense, but means that "the hole diameter is small in the portion with an increased reinforcer density, while the hole diameter is large in the portion with a decreased reinforcer density." Hereinafter, this term will be used in this sense.

In a usual production process of the circuit board, the drill normally is lifted off immediately after penetrating a material. This is for ensuring hole quality (forming holes with a uniform diameter), preventing the drill breakage and improving efficiency. In this case, holes having substantially the same diameter are formed regardless of the density of the fibers.

For example, when holes were formed according to the present embodiment by using a prepreg having a thickness of about 70 μm, the holes in the overlapping portions of the warps and wefts of the glass cloth (the highest-density portions of the glass fibers) had a diameter of 150 μm, those in the sparse portions of the cloth (the lowest-density portions of the glass fibers) had a diameter of 180 μm, and those in the rest had a diameter varying from 150 to 180 μm inversely with the glass fiber density. The holes provided in the overlapping portions of the warps and wefts of the glass cloth were small enough to fit in the overlapping portions.

Figure 2C:
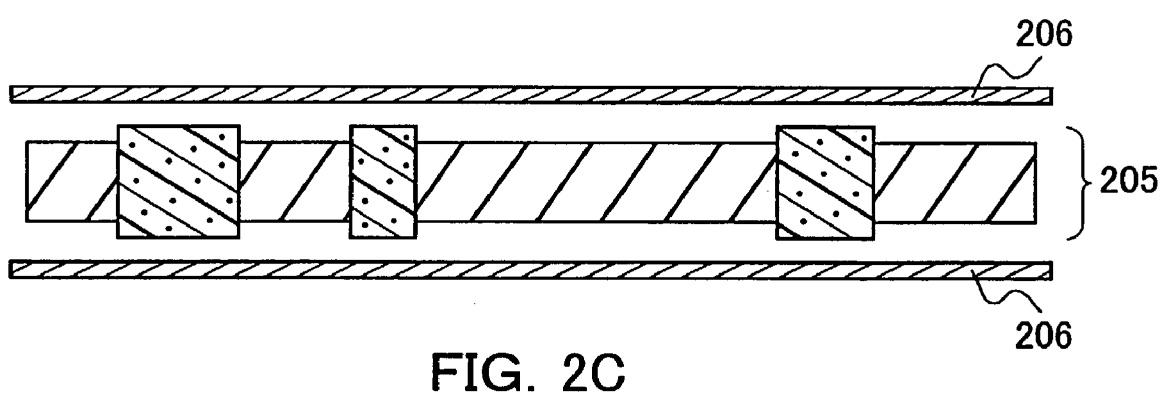

Next, metal foils 206 having a thickness of 18 μm for forming a wiring pattern are superposed on both surfaces of the connection intermediate 205, followed by heating and compression with a hot press (see FIG. 2C). The condition of the hot press can be the one for general circuit boards and, for example, at 180° C. to 250° C. at 30 to 200 kgf/cm$^2$ for 0.5 to 2 hours. This process cures the resin in the prepreg and the resin in the electrically conductive paste, thus adhering the metal foils to the prepreg and electrically connecting the metal foils on both sides via the electrically conductive paste.

Figure 2D:
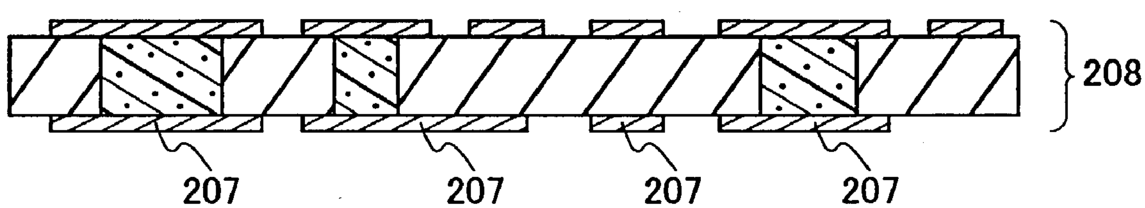

Finally, the metal foil is processed into a wiring pattern 207, thus completing a double-sided circuit board 208 (see FIG. 2D). The wiring pattern can be processed by a general wiring processing technique for circuit boards such as photolithography.

The connection resistance of the inner via hole decreases with increasing cross-section of the inner via hole. Also, as an effective pressure applied to electrically conductive fillers (an electrically conductive filler and a copper foil) becomes larger, the number and the size of contacts increase, thus reducing the connection resistance. In order to increase the effective pressure, it is necessary not only to raise the pressure of the hot press but also to adopt a structure in which a side wall surface of the inner via hole does not expand laterally. In this embodiment, such a structure can be achieved by providing the holes that are small enough to fit in the overlapping portions of the glass cloth.

In the present embodiment, the inner via holes (through holes) are formed to have a diameter of 150 μm in the highest-density portions of the reinforcer (the overlapping portions of the fibers of the glass cloth) because the side wall surfaces of these portions do not expand easily. The inner via holes are formed to have a diameter of 180 μm in the lowest-density portions of the reinforcer (the sparse portions of the glass cloth) because the effective pressure can be applied least easily. In the other portions, the inner via holes are formed to have a diameter varying from 150 to 180 μm inversely with the glass fiber density. The inner via holes of the present embodiment produced under the above-mentioned perforating condition can achieve a connection resistance with very small variation of about 2 to 3 mΩ. However, the diameter of the inner via holes is not limited to those described above.

Figure 3A:
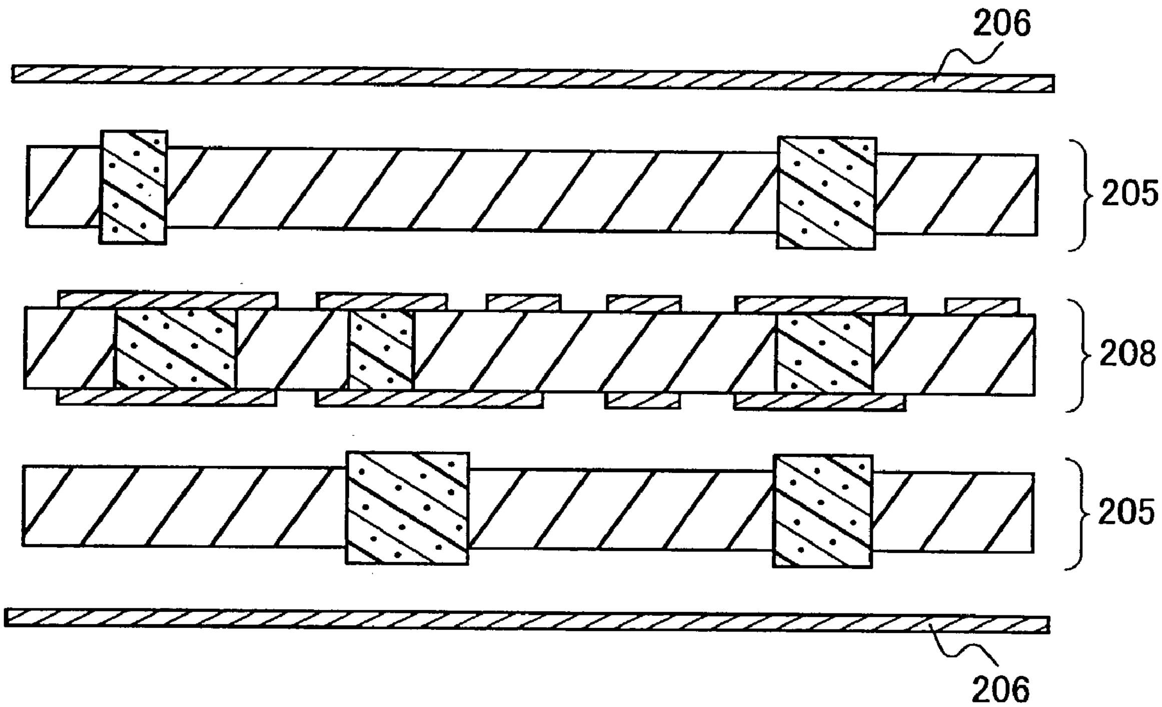
FIGS. 3A to 3B are drawings for explaining processes in the method for manufacturing the circuit board (having through holes) according to the first embodiment of the present invention.
Figure 3B:
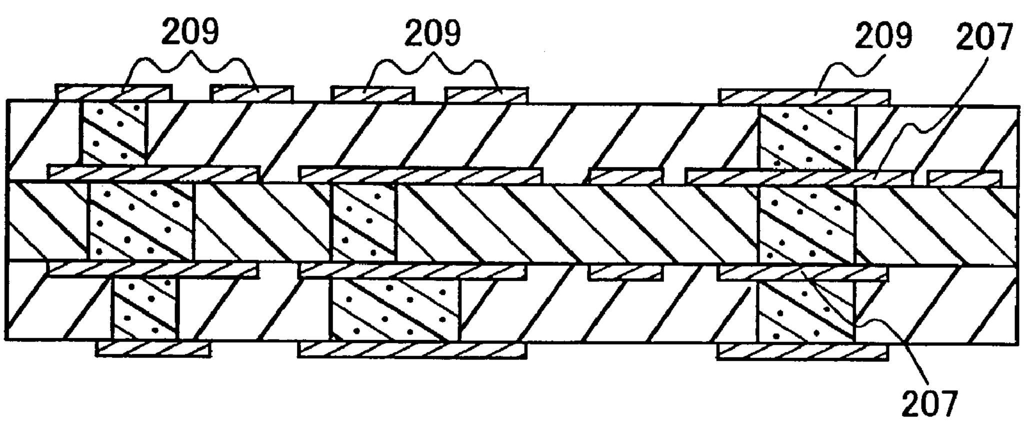

The above-described connection intermediates 205 and the metal foils 206 are superposed on both sides of the double-sided circuit board 208 of the present embodiment as a core substrate (see FIG. 3A), and the core substrate and the prepregs are laminated with the hot press as in the case of the double-sided circuit board. Finally, the metal foils are processed into a wiring pattern 209, thus obtaining a four-layered circuit board (see FIG. 3B).

Further, a multilayered circuit board can be produced by repeating the above-described laminating process using the multilayered circuit board as a core substrate.

In the multilayered circuit board of the present embodiment, the wiring layers 207 of the core substrate are embedded in the prepregs to be laminated on both sides of the core substrate. In other words, since the wiring layers are embedded also in the inner via portions, the compressibility of the inner via holes increases during the press process, thereby further lowering the connection resistance and reducing the variations thereof.

Figure 4A:
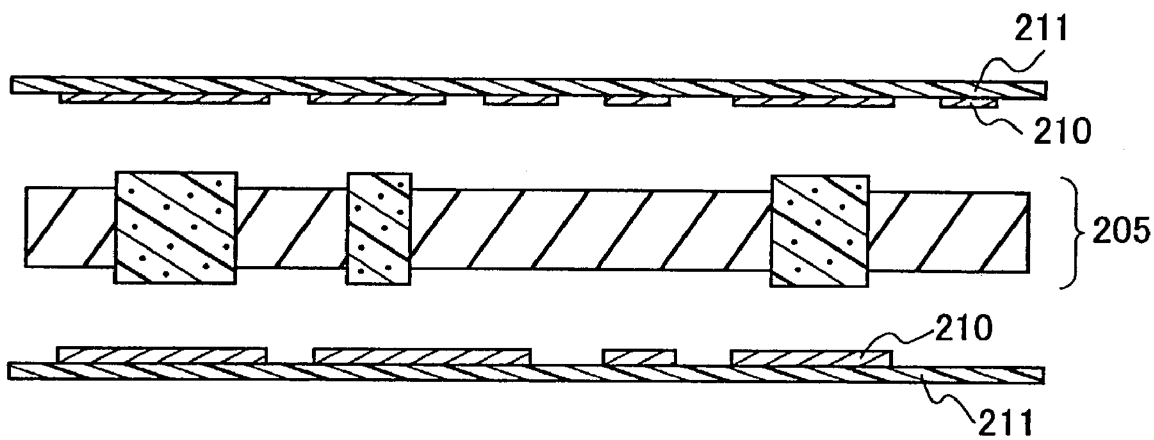
FIGS. 4A to 4B are drawings for explaining processes in the method for manufacturing the circuit board (having through holes) according to the first embodiment of the present invention.
Figure 4B:
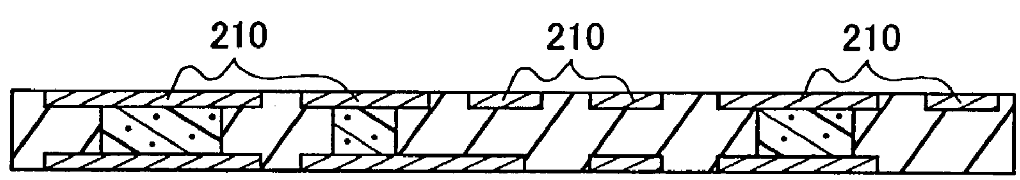
Figure 5A:
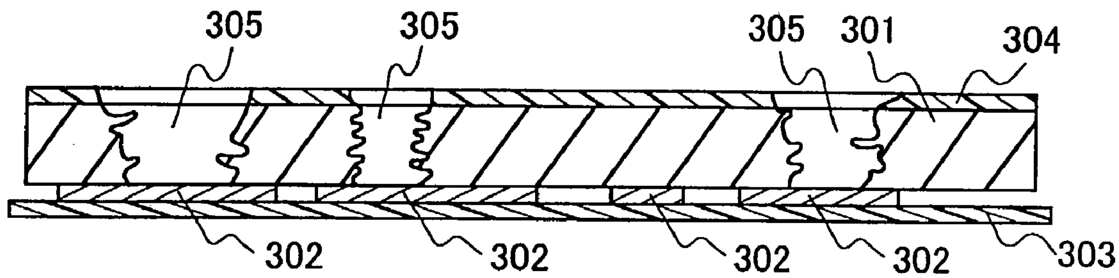
FIGS. 5A to 5D are drawings for explaining the method for manufacturing the circuit board (having non-through holes) according to the first embodiment of the present invention.
Figure 5B:
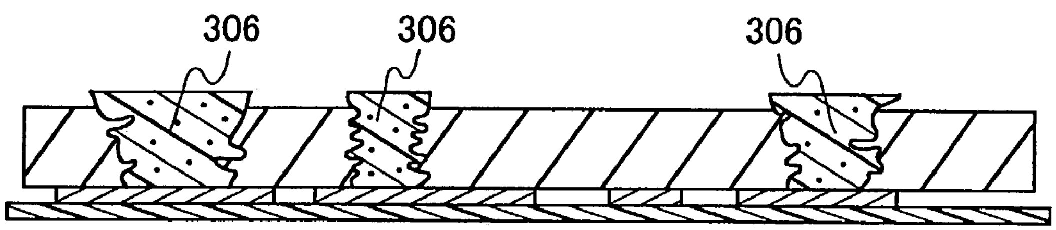
Figure 5C:
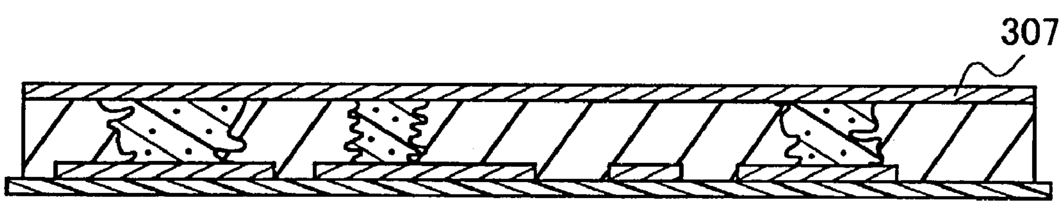
Figure 5D:
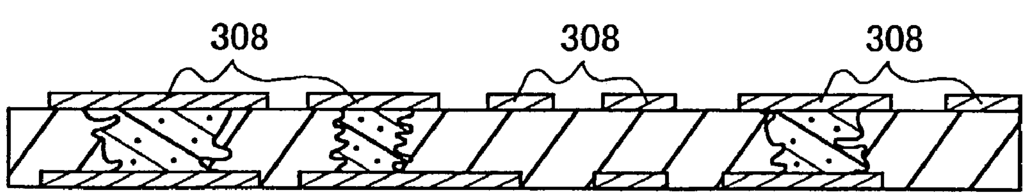

Also in the double-sided circuit board, the wiring layers can be embedded by using a wiring transferring method, thereby achieving a still lower connection resistance with reduced variations in a similar manner. More specifically, as shown in FIG. 4A, it is possible to use what is called a metal foil provided with a carrier, which is obtained by forming a metal foil on a support substrate (a carrier). An example of the metal foil provided with the carrier 211 includes commercially available metal foils that are obtained by laminating a copper foil onto an aluminum carrier via a releasing layer. In the case of the embodiment of the present invention, the copper foil is patterned by etching with a ferric chloride solution or an ammonium persulfate solution beforehand, and then the wiring layers 210 are laminated so as to be embedded in the connection intermediate 205. Subsequently, the aluminum carrier can be removed by etching with hydrochloric acid or the like (see FIG. 4B).

The method for forming through holes using the mechanical drill in the present embodiment, of course, is not limited to the above but can be the one using drills having different diameters. In other words, the inner via holes in the portions other than the overlapping portions of the glass fibers (the high-density portion of the reinforcer sheet) are formed by a drill having a smaller diameter than that used for forming the inner via holes in the overlapping portions. The drill diameter has to be selected according to density distribution in every working when the density distribution of the reinforcer is irregular. On the other hand, it is preferable to use the reinforcer with regular density distribution such as a glass woven fabric because such an extra process is not needed (or is reduced, thus the process becomes simple).

Other than the above method for forming the through holes, the inner via holes (thorough holes) of the present embodiment similarly can be formed by a regular perforating method of circuit boards, that is, by a carbon dioxide gas laser, a YAG laser or an excimer laser, or by punching.

Figure 11:
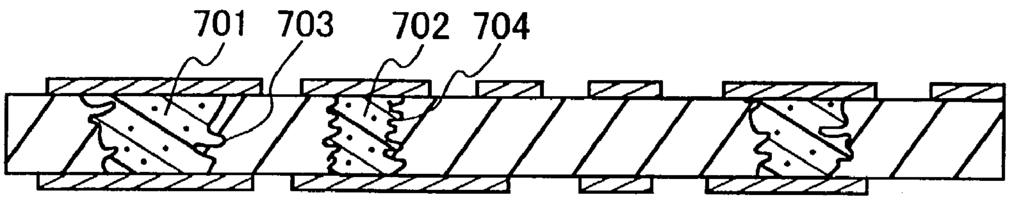
FIG. 11 is a schematic cross-sectional view showing a circuit board provided with inner via holes having protruding glass fibers according to the first embodiment of the present invention.

As shown in FIG. 11, when the through holes are formed by the carbon dioxide gas laser, inner via holes 702 formed in the high-density portions of the glass fibers (inner via holes having a small diameter) have many glass fibers 704 protruding toward the inside of the inner via holes. On the other hand, inner via holes 701 formed in the low-density portions of the glass fibers (inner via holes having a large diameter) have relatively fewer glass fibers 703 protruding toward the inside of the inner via holes. With such a structure, the inner via holes and the glass-epoxy base material of the surrounding insulator layer adhere well to each other by an anchor effect, thus increasing a strength with respect to a mechanical (or a thermal) stress. This raises the connection reliability of the inner via holes having a small diameter. Since the inner via holes having a small diameter have fewer contacts with the electrical conductors, the connection reliability thereof is likely to become lower than that of the inner via holes having a large diameter. However, the connection reliability of the inner via holes having a small diameter can be raised by the above method, making it possible to improve the connection reliability of the entire substrate.

In the case of using a carbon dioxide gas laser, for example, a carbon dioxide gas laser with a wavelength of 9.4 or 10.6 μm can be used. The number of shots suitably is 1 to 3. In this example, the effect of the present invention became greater as wavelength increased and the number of shots decreased. The perforating process utilizes the difference in processability that is caused by the difference of the density distribution of the glass cloth base material when irradiating the same laser. This relationship is shown below.

| Density | Glass cloth | Perforating processability |
|---|---|---|
| Large | Warps and wefts overlap | Not easy |
| Small | Sparsely woven | Easy |

Next, the wavelength of the laser beam will be described. In a laser having the same energy, a decrease in wavelength generally reduces a laser spot diameter, and thus increases an energy density of the laser. The laser having a large energy density makes it easier to perforate a sheet using a glass cloth, which generally is difficult to perforate, thus forming holes having a diameter with less variation regardless of the density distribution of the base material. On the other hand, an increase in wavelength expands a laser spot diameter, and thus reduces the energy density. Accordingly, the portion of a matrix resin, which is easy to perforate, can be perforated easily, while the portion of the glass cloth is difficult to perforate, so as to be susceptible to the density distribution of the base material. In other words, the overlapping portions of the warps and wefts of the glass cloth are provided with small holes, while the sparse portions are provided with large holes. Therefore, it is preferable that the wavelength of the laser beam is large.

In the following, the number of shots will be described. In the laser irradiation, an increase in the number of shots raises the entire amount of energy input. For example, two shots require twice as much energy as one shot. Thus, a plurality of shots at one position raises the entire amount of energy, so that the glass cloth, which could not be processed by the first shot, can be perforated by the second or the third shot, thereby achieving a uniform diameter regardless of the density distribution of the base material. On the other hand, the small number of shots raises the susceptibility to the density distribution of the base material. In other words, the overlapping portions of the warps and wefts of the glass cloth are provided with small holes, while the sparse portions are provided with large holes. Therefore, it is preferable that the number of the shots is 1 to 3.

In the present embodiment, the inner via holes are through holes, but they may be non-through holes. The method for producing the circuit board in the case of the non-through holes is illustrated in FIGS. 5A to 5D.

First, a wiring transferring material provided with a wiring pattern 302 is placed on one surface of a prepreg 301 so that its wiring faces the prepreg, while a cover film 304 is placed on the other surface thereof, and then they temporarily are attached by pressure. Next, blind via holes (non-through holes) 305 are formed at desired positions by a carbon dioxide gas laser or the like (see FIG. 5A), and then filled with an electrical conductor (an electrically conductive paste) 306. Subsequently, the cover film is removed (see FIG. 5B), and a metal foil 307 is superposed on the side where the cover film has been removed, followed by heating and compression by a hot press (see FIG. 5C). The metal foil is processed into a wiring pattern 308, and then a support substrate 303 of the wiring transferring material is removed, thus completing a double-sided circuit board (see FIG. 5D). When using a layered product (a circuit board transferring material), whose metal foil has been processed into the wiring pattern, as a transferring material and repeating the above-described process necessary times, it is possible to produce a multilayered circuit board. With this method, since via holes are formed at positions according to the position of the wiring pattern, it is possible to improve the dimensional accuracy.

Second Embodiment

Figure 6:
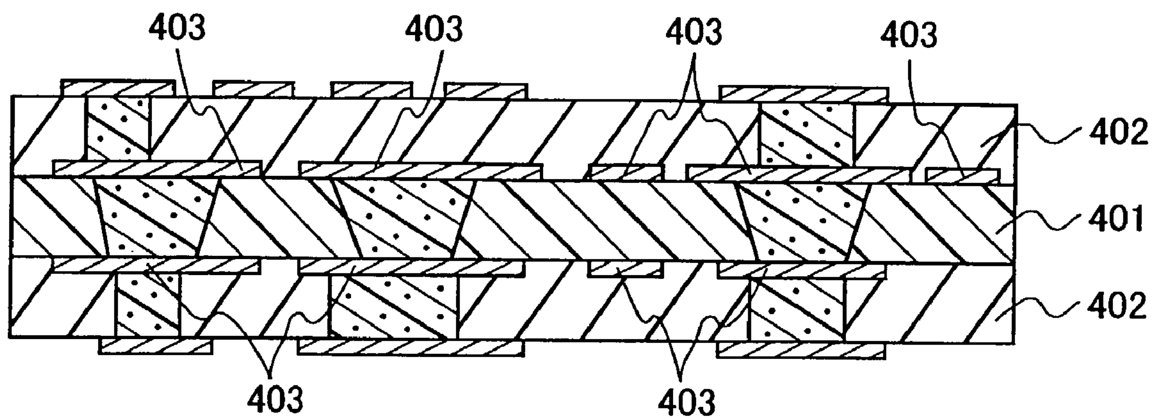
FIG. 6 is a schematic cross-sectional view showing a multilayered circuit board according to a second embodiment of the present invention.

FIG. 6 is a schematic cross-sectional view showing a multilayered circuit board according to the second embodiment of the present invention. The multilayered circuit board of the present embodiment has a structure in which the circuit board described in the first embodiment is laminated on at least one surface of a core substrate formed of a compressible insulator base material. In this figure, a double-sided circuit board 401 of an aramid-epoxy substrate is used as the core substrate, and circuit boards 402 formed of a glass-epoxy base material described in the first embodiment are laminated on both sides of the core substrate.

The multilayered circuit board of the present embodiment can be produced as follows.

First, a double-sided circuit board is produced by using an aramid-epoxy prepreg. Cover films temporarily are attached by pressure onto both surfaces of the aramid-epoxy prepreg, and then through holes are formed. The through holes can be formed to have a diameter of 200 $\mu$m by, for example, a carbon dioxide gas laser. The aramid-epoxy prepreg is a composite material obtained by impregnating a non-woven fabric of aramid fibers with an epoxy resin. Since the aramid-epoxy prepreg has many pores therein so as to be compressible, inner via holes can achieve connection reliability with less variation even without using the method described in the first embodiment. Needless to say, it is preferable to change the hole diameter according to the density of the reinforcer (the aramid non-woven fabric, in this case) so as to achieve still less variation, as shown in the first embodiment.

Next, the through holes are filled with an electrically conductive paste, and the cover film is removed, thus completing a connection intermediate formed of the aramid-epoxy base material. Thereafter, a double-sided circuit board of the aramid-epoxy substrate can be obtained as in the first embodiment. In addition, the through holes may be formed using a laser or a drill.

Figure 12:
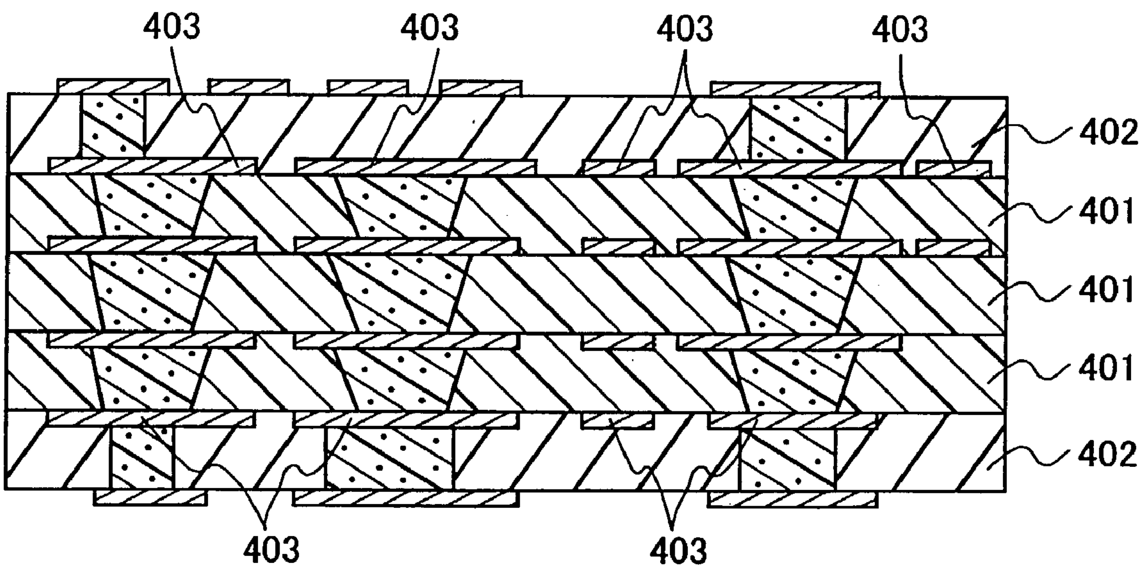
FIG. 12 is a schematic cross-sectional view showing a four-layered circuit board obtained in the second embodiment of the present invention.

Using this as the core substrate, the connection intermediates and the metal foils described in the first embodiment are superposed on both sides of the core substrate, laminated by a hot press as in the first embodiment, and then the metal foils are processed into a wiring pattern. Thus, a four-layered circuit board (four-layer here indicates four wiring layers) is completed. The compressible core substrate may be a multilayered circuit board. FIG. 12 shows an example of the four wiring layers as the core substrate.

If necessary, a multilayered circuit board with still more layers can be produced by using the multilayered circuit board of the present embodiment as the core substrate and repeating the process of the present embodiment.

In the multilayered circuit board of the present embodiment, the wiring layers are embedded in all the insulator layers of the glass-epoxy base material. Thus, as described in the first embodiment, it is possible to achieve connection resistance with still less variation. Although the wiring layer is not embedded in the core substrate, the compressibility of the aramid-epoxy prepreg compensates for this, so that the inner via holes can be compressed sufficiently. In other words, the multilayered circuit board of the present embodiment can achieve connection resistance with still less variation over all the layers. Moreover, when the glass-epoxy base materials are laminated on both sides, it becomes less likely that the aramid-epoxy base material is exposed and absorbs moisture. Furthermore, since the glass-epoxy base material has an excellent mechanical strength, it is possible to achieve a substrate having a better mechanical strength than the multilayered circuit board formed by the aramid-epoxy base material alone.

Third Embodiment

Figure 7:
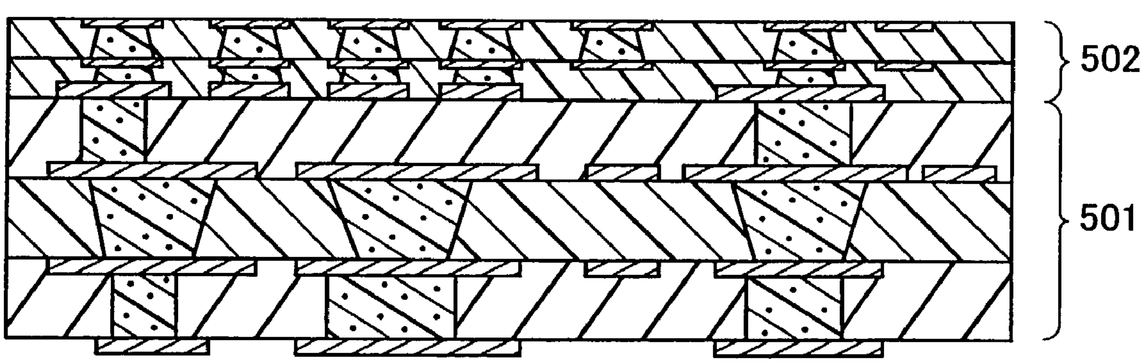
FIG. 7 is a schematic cross-sectional view showing a multilayered circuit board according to a third embodiment of the present invention.

FIG. 7 is a schematic cross-sectional view showing a multilayered circuit board according to the third embodiment of the present invention. The multilayered circuit board according to the present embodiment has a structure in which a circuit board 501 of the first or the second embodiment is used as a core substrate and a circuit board 502 with an insulator layer thinner than that of the core substrate is laminated on at least one surface of the core substrate. In a thinner insulator layer, it is possible to form finer inner via holes with lower resistance. This is because, even when the hole diameter is the same, a reduction in the length of the inner via hole, namely, the thickness of the insulator layer, decreases the connection resistance.

The following is a description of the case of using the four-layered circuit board of the second embodiment as the core substrate and a polyimide film as the insulator layer thinner than that of the core substrate.

Figure 8A:
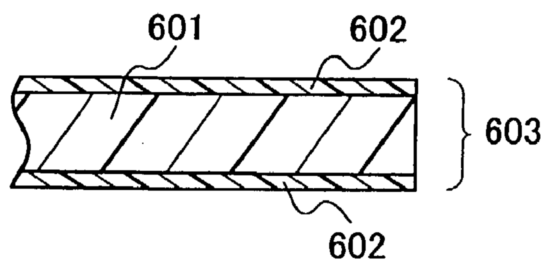
FIGS. 8A to 8D are drawings for explaining a method for manufacturing the multilayered circuit board according to the third embodiment of the present invention.
Figure 8B:
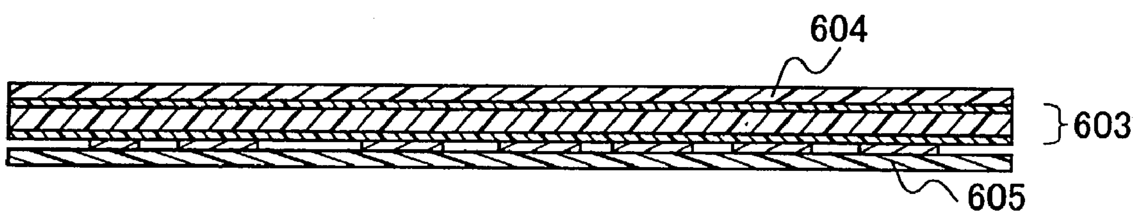

The multilayered circuit board of the present embodiment can be produced as follows. First, the method for producing a substrate of the insulator layer of the polyimide film will be described. A cover film 604 is placed on one surface of a film (a thin insulator layer 603) obtained by forming adhesive layers 602 on both surfaces of a polyimide film 601 as shown in FIG. 8A, and a wiring pattern provided with a carrier 605 is placed on the other surface thereof, and then they temporarily are attached by pressure as shown in FIG. 8B. The adhesive layers 602 can be a polyimide-based adhesive or an epoxy-based adhesive. With regard to the thickness of the film, adhesive layers of 5 μm thickness each are formed on both surfaces of a polyimide film of 13 μm thickness, for example. The cover film can be the same as that of the first embodiment. Also, the wiring pattern can be the one obtained by forming a wiring pattern on a copper foil provided with a carrier used for a transferring method, which is described in the first embodiment.

Figure 8C:
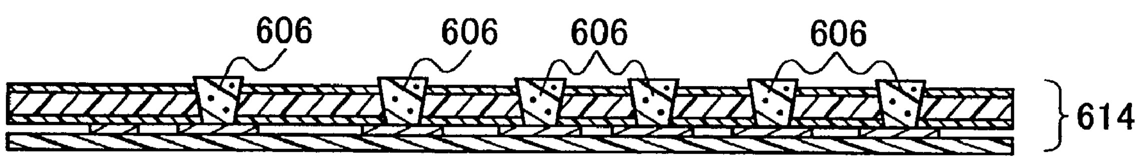

Next, as shown in FIG. 8C, non-through holes are formed in the film and filled with an electrical conductor 606, and then the cover film is removed. Thus, a double-sided circuit transferring material intermediate 614 is completed. The non-through holes can be formed by a laser perforating method. For example, an UV-YAG laser (the third harmonic: wavelength of 355 nm) can be used. The UV-YAG laser is preferable because it is possible to form fine non-through holes (having a diameter of about 30 to 50 μm in the present embodiment) without damaging the copper foil.

The electrical conductor can be an electrically conductive paste as in the first embodiment. The electrically conductive paste can be filled by printing using a squeegee. It is preferable that pressure is reduced during or after the filling of the non-through holes. This pressure reduction is for removing voids taken in when filling the paste from an opening. Also, it is preferable that a roughened copper foil whose surface is provided with roughness is used as the copper foil so as to attach temporarily onto the adhesive layer while leaving a space (a fine space corresponding to the roughness of the copper foil surface and being smaller than an electrically conductive filler of the electrically conductive paste) therebetween. This is because the resin contained in the electrically conductive paste escapes from this space during the filling of the electrically conductive paste or the compression, so that the ratio of an electrically conductive powder contained in the inner via hole increases, thereby achieving still lower resistance.

Figure 8D:
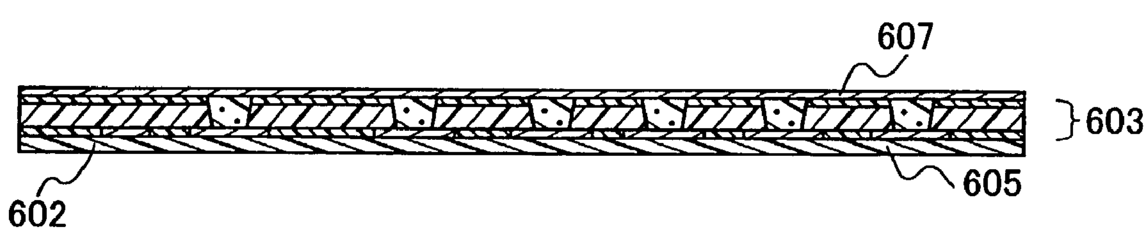

Then, as shown in FIG. 8D, a metal foil 607 is superposed on the double-sided circuit transferring material intermediate 614 on the side where the cover film has been removed, followed by heating and compression by a hot press. At this time, the wiring pattern is embedded into the adhesive layer 602. The condition of the hot press can be the same as that in the first embodiment.

Figure 9A:
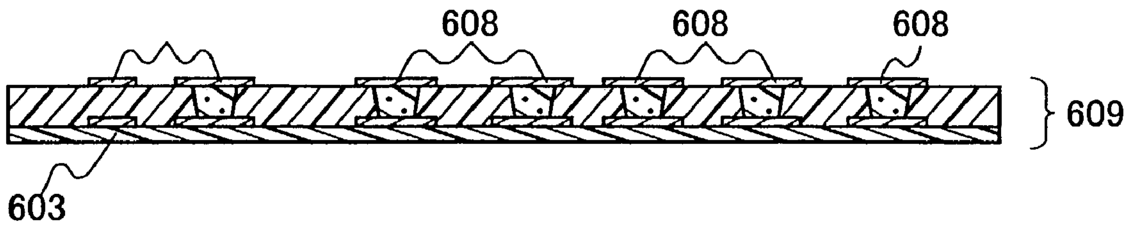
FIGS. 9A to 9C are drawings for explaining the method for manufacturing the multilayered circuit board according to the third embodiment of the present invention.

Subsequently, the metal foil is processed into a wiring pattern 608 by a normal photolithography, thus completing a double-sided circuit transferring material provided with a carrier 609 (see FIG. 9A).

Figure 9B:
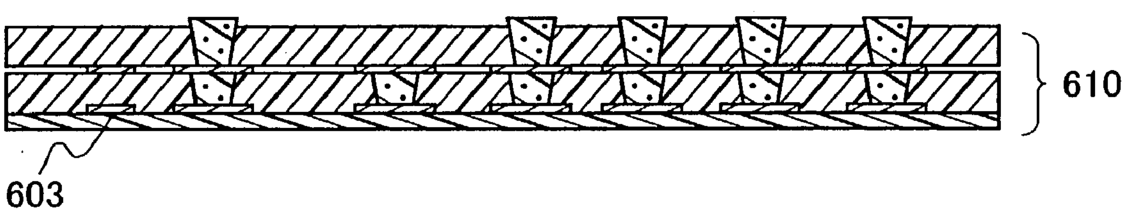
Figure 9C:
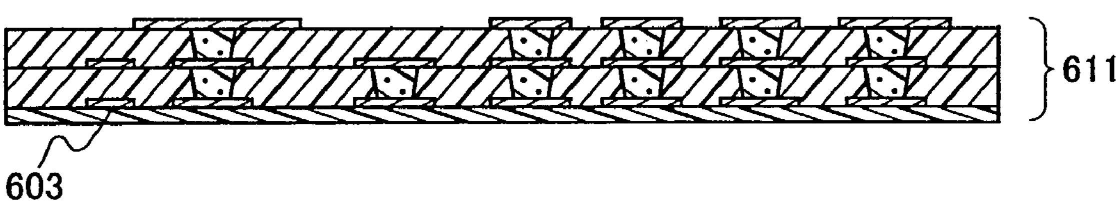

When using the double-sided circuit transferring material provided with the carrier 609 as the metal foil provided with the carrier and repeating the above-described process, it is possible to produce a multilayered transferring material intermediate 610 (see FIG. 9B) and a multilayered circuit transferring material 611 (see FIG. 9C).

The above description is directed to the case of using the polyimide film as the insulator layer thinner than that of the core substrate. However, it also is possible to use the one obtained by forming an adhesive on a film formed of a material such as BCB (benzocyclobutene), PTFE (polytetrafluoroethylene), aramid, PBO (polyparaphenylene benzobisoxazole) or all aromatic polyester. When using a thermoplastic film, the film can be used without an adhesive because the film itself becomes adhesive when being heated.

Next, the transferring material is laminated on the core substrate.

Figure 10A:
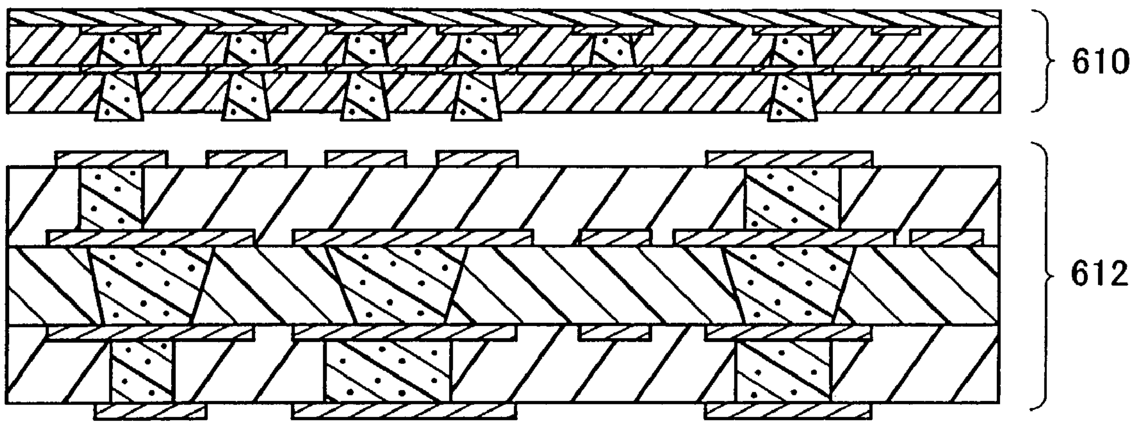
FIGS. 10A to 10B are drawings for explaining the method for manufacturing the multilayered circuit board according to the third embodiment of the present invention.

The core substrate can be a circuit board 612 described in the first or the second embodiment. The transferring material intermediate 610 is superposed on at least one surface of the core substrate 612 as shown in FIG. 10A, and then laminated by a hot press. The condition of the hot press can be the same as that in the first embodiment. Finally, the carrier of the transferring material intermediate is removed by etching, thus completing a multilayered circuit board of the present embodiment.

Figure 10B:
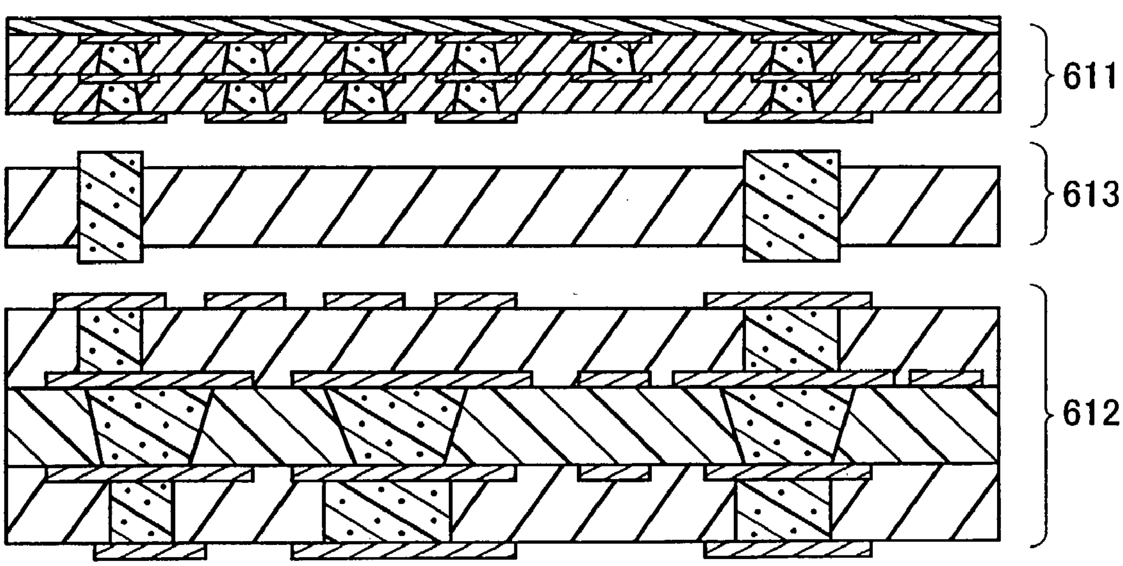

Also, instead of using the transferring material intermediate, a (multilayered) circuit transferring material 611 of the present embodiment is laminated on the core substrate 612 via a connection intermediate 613 of the first or the second embodiment, thereby producing the multilayered circuit board of the present embodiment (see FIG. 10B).

The present embodiment is directed to the method of transferring the thin insulator layer on the core substrate with the wiring transferring material. With this method, the finer circuit formed on the thin insulator layer and the core substrate can be produced separately. As a result, it becomes possible to reduce contamination by dust in the fine circuit portion and improve an overall yield compared with the method of sequentially laminating layers on top of the core substrate.

In the multilayered circuit board of the present embodiment, it is possible to use the circuit board having an IVH structure over all the layers provided with connection resistance with less variation, which is described in the first and second embodiments, as a core substrate so as to form wiring layers with higher density thereon. The circuit board produced with an insulator layer of a thin polyimide film alone is difficult to be applied to a field requiring a mechanical strength. On the other hand, the multilayered circuit board of the present embodiment can achieve the mechanical strength and the high-density fine wiring (including the core substrate) and especially is preferable as a circuit board for package on which a relatively large semiconductor is mounted directly.

The core substrate can be a general circuit board (a glass-epoxy through hole circuit board, a built-up circuit board or a multilayered circuit board using an aramid fiber non-woven fabric impregnated with an epoxy resin). In addition, as shown in the figure, the above-described transferring material can be laminated directly on the metal foil for forming the wiring via the connection intermediate.

The invention may be embodied in other specific forms without departing from the spirit or essential characteristics thereof The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A method for manufacturing a circuit board comprising:

providing a plurality of inner via holes to be filled with an electrically conductive paste in an insulator layer having a reinforcer sheet with density distribution in its in-plane direction, the reinforcer sheet being a woven fabric formed of a glass fiber, wherein the inner via holes provided in overlapping portions of wraps and wefts of the woven fabric formed of the glass fiber have a smaller cross-section than the inner via holes provided in portions other than the overlapping portions;

filling the electrically conductive paste in the inner via holes; and laminating at least one selected from the group consisting of a wiring layer and a metal foil for forming a wiring layer so as to be connected to the electrically conductive paste, followed by heating and compression.

2. The method for manufacturing a circuit board according to claim 1, wherein the inner via holes provided In the high-density portion of the reinforcer sheet are formed to have a smaller cross-section than the inner via boles provided in the low-density portion of the reinforcer sheet by inserting a rotating drill in a thickness direction of the reinforcer sheet to form a through hole, stopping the drill while keeping it rotating, and then pulling out the drill.

3. The method for manufacturing a circuit board according to claim 1, wherein the inner via holes provided in the high-density portion of the reinforcer sheet are formed to have a smaller cross-section than the inner via boles provided in the low-density portion of the reinforcer sheet by thermal laser machining.

4. The method for manufacturing a circuit board according to claim 1, wherein a plurality of the wiring layers are provided, and at least one of the wiring layers is embedded in the insulator layer.

5. The method for manufacturing a circuit board according to claim 1, wherein a first circuit board is manufactured using the steps of claim 1 and a second circuit board formed of a compressible electrical insulating material further is laminated on one surface of the first circuit board.

6. The method for manufacturing a circuit board according to claim 1, wherein a plurality of circuit boards are manufactured using the steps of claim 1 and a circuit board formed of a compressible electrical insulating material further is laminated as a core substrate between the plurality of circuit boards arranged on both sides of the core substrate.

7. The method for manufacturing a circuit board according to claim 1, wherein a first circuit board is manufactured using the steps of claim 1 to be used as a core substrate, and at least one circuit board formed of an insulator layer thinner than the insulator layer of the core substrate is laminated on at least one surface of the core substrate.

8. A method for manufacturing a circuit board comprising:

providing a plurality of inner via holes to be filled with an electrical conductor in an insulator layer having a reinforcer sheet with density distribution in its in-plane direction, the reinforcer sheet being a woven fabric formed of a glass fiber, wherein the inner via holes provided in overlapping portions of wraps and wefts of the woven fabric formed of the glass fiber have a smaller cross-section than the inner via holes provided in portions other than the overlapping portions; and filling the electrical conductor in the inner via holes.

* * * * *

UNITED STATES PATENT AND TRADEMARK OFFICE

CERTIFICATE OF CORRECTION

PATENT NO. : 6,996,902 B2
APPLICATION NO. : 10/389515
DATED : February 14, 2006
INVENTOR(S) : Suzuki et al.

It is certified that error appears in the above-identified patent and that said Letters Patent is hereby corrected as shown below:

Col. 15, line 20: “In the” should read --in the--
Col. 15, line 22: “boles” should read --holes--
Col. 15, line 30: “boles” should read --holes--

Signed and Sealed this

Fourteenth Day of November, 2006

JON W. DUDAS
*Director of the United States Patent and Trademark Office*